(12) United States Patent
Altonen et al.

(10) Patent No.: US 7,233,153 B2
(45) Date of Patent: Jun. 19, 2007

(54) METHOD AND SYSTEM FOR DETERMINING LOCATION OF PHASE-TO-EARTH FAULT

(75) Inventors: Janne Altonen, Toijala (FI); Ari Wahlroos, Vaasa (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 11/476,547

(22) Filed: Jun. 29, 2006

(65) Prior Publication Data

US 2007/0014059 A1    Jan. 18, 2007

(30) Foreign Application Priority Data

Jun. 29, 2005    (FI) .................................. 20055359

(51) Int. Cl.
*G01R 31/08*    (2006.01)
*G01R 31/00*    (2006.01)

(52) U.S. Cl. .......................................... 324/525; 702/59

(58) Field of Classification Search ................ 324/525, 324/522; 702/59; 361/42

See application file for complete search history.

(56) References Cited

U.S. PATENT DOCUMENTS

| | | | |
|---|---|---|---|
| 5,773,980 A * | 6/1998 | Yang | 324/525 |
| 6,256,592 B1 | 7/2001 | Roberts et al. | |
| 6,483,435 B2 | 11/2002 | Saha et al. | |
| 2004/0032265 A1 | 2/2004 | Turner | |
| 2004/0167729 A1 | 8/2004 | Saha et al. | |

FOREIGN PATENT DOCUMENTS

| | | |
|---|---|---|
| EP | 1 089 081 A2 | 4/2001 |
| EP | 1 304 580 A1 | 4/2003 |
| WO | 99/46609 A1 | 9/1999 |

OTHER PUBLICATIONS

Finnish Office Action dated Dec. 20, 2005.
Dr. Edmund O. Schweitzer, III et al., A Review of Impedance-Based Fault Locating Experience, Presented Before the Fourteenth Annual Iowa-Nebraska, System Protection Seminar, Oct. 16, 1990, Omaha, Nebraska, pp. 1-31.
European Search Report dated Oct. 23, 2006.

* cited by examiner

*Primary Examiner*—Anjan Deb
(74) *Attorney, Agent, or Firm*—Buchanan Ingersoll & Rooney PC

(57) ABSTRACT

A method and system for determining a location of a phase-to-earth fault in a line of an electric network, the electric line comprising two or more sections (30a, 30b, 30c), the system being configured to determine, at a measuring point, a reactance of a fault loop; determine a faulted section of the electric line to be a section closest to the measurement point of all such sections for which a sum of a positive sequence reactance and an earth return path reactance of the section in question and positive sequence reactances and an earth return path reactances of sections, if any, between the measurement point and the section in question is greater than or equal to the determined reactance of the fault loop; and calculate a distance between the measuring point and a point of fault on the basis of the reactance values.

10 Claims, 2 Drawing Sheets

METHOD AND SYSTEM FOR DETERMINING LOCATION OF PHASE-TO-EARTH FAULT

The present application claims priority under 35 USC §119 to Finnish Patent Application No. 20055359 filed Jun. 29, 2005, the contents of which are hereby incorporated by reference in their entirety.

FIELD OF THE INVENTION

The present invention relates to localization of earth faults in electric networks.

BACKGROUND OF THE INVENTION

A feeder of a distribution network typically consists of many different types of over-headline and/or cable sections. This means that electrically the feeder is non-homogeneous.

Conductor parameters (resistance, inductance and capacitance) can vary greatly, depending on conductor type and configuration. Especially overhead-line and cable parameters differ from each other. Typically, the angle of the positive sequence impedance on cables is substantially less than on overhead-lines. Also different overhead-line types differ from each other. The same applies to cables.

Inherently, the result of an impedance based fault localization algorithm is an electrical length to fault, i.e. the result is in the form of (loop) impedance. FIG. 1 illustrates a fault loop model for a phase-to-earth fault at point F of an electric line (feeder). For phase-to-earth faults, the fault loop impedance is:

$$Z_{Loop} = d \cdot (Z_1 + Z_N) + R_F \quad (1)$$

Where
d=fault location in per unit value (0 ... 1)
$Z_1$=positive sequence impedance of the line=$R_1 + j \cdot X_1$
$R_1$=positive sequence resistance of the line
$X_1$=positive sequence reactance of the line
$Z_N$=earth return path impedance of the line=$(Z_0 - Z_1)/3 = R_N + j \cdot X_N$
$R_N$=earth return path resistance of the line=$(R_0 - R_1)/3$
$X_N$=earth return path reactance of the line=$(X_0 - X_1)/3$
$Z_0$=zero sequence impedance of the line=$R_0 + j \cdot X_0$
$R_0$=zero sequence resistance of the line
$X_0$=zero sequence reactance of the line
$R_F$=fault resistance. For phase-to-earth loop this typically includes arc and tower footing resistances.

In the case of a non-homogeneous line, the impedances of individual line sections vary and the line impedance is the sum of the impedances of the sections:

$$Z_1 = Z_{1A} + Z_{1B} + Z_{1C} + \ldots$$

$$Z_N = Z_{NA} + Z_{NB} + Z_{NC} + \ldots$$

where
$Z_{1A}$=positive sequence impedance of line section A,
$Z_{1B}$=positive sequence impedance of line section B,
$Z_{1C}$=positive sequence impedance of line section C,
$Z_{NA}$=earth return path impedance of line section A,
$Z_{NB}$=earth return path impedance of line section B,
$Z_{NC}$=earth return path impedance of line section C.

As a result, the electrical distance to fault (an ohmic value) cannot be directly converted into a physical distance, such as miles, kilometers or per unit value. However, while distribution lines are in most cases non-homogeneous, the impedance algorithms applied in protective relays typically do not take this into account, which may cause a considerable error in a fault location estimate.

Document U.S. Pat. No. 6,483,435 discloses a method and device for fault location for distribution networks. In the solution disclosed, the non-homogeneity of a feeder is taken into account. The solution, however, is computationally rather burdensome as e.g. individual loads on the feeder are taken into account.

Document "A review of impedance-based fault locating experience"; Edmund O. Schweitzer; 14th annual Iowa-Nebraska system protection seminar; Oct. 16, 1990; Omaha, Nebr., discloses a calculation procedure for locating a ground fault on a non-homogeneous line. This solution is also computationally burdensome and thus difficult to implement in a protective relay.

BRIEF DESCRIPTION OF THE INVENTION

An object of the present invention is thus to provide a method and an apparatus for implementing the method so as to overcome the above problem or at least to alleviate it. The object of the invention is achieved by a method, a system and a computer program product which are characterized by what is stated in independent claims 1, 5 and 10. Preferred embodiments of the invention are disclosed in the dependent claims.

The invention is based on the idea of determining a faulted section of the electric line and thereafter the distance to the fault on the basis of a reactance of a fault loop and predetermined positive sequence reactances and an earth return path reactances of the line sections.

An advantage of the method and system of the invention is that an estimate for a location of a phase-to-earth fault can be determined accurately also on non-homogeneous lines without substantially increasing the computational capacity required.

BRIEF DESCRIPTION OF THE DRAWINGS

In the following, the invention will be described in greater detail by means of preferred embodiments with reference to the attached drawings, in which.

DETAILED DESCRIPTION OF THE INVENTION

A use of the method and system of the invention is not limited to any specific system, but they can be used in connection with various three-phase electric systems to determine a location of a phase-to-earth fault in a three-phase electric line of an electric network. The electric line can be a feeder, for example. The electric network can be an electric transmission or distribution network or a component thereof, for example. Moreover, the use of the invention is not limited to systems employing 50 Hz or 60 Hz fundamental frequencies or to any specific voltage level.

Figure 1:
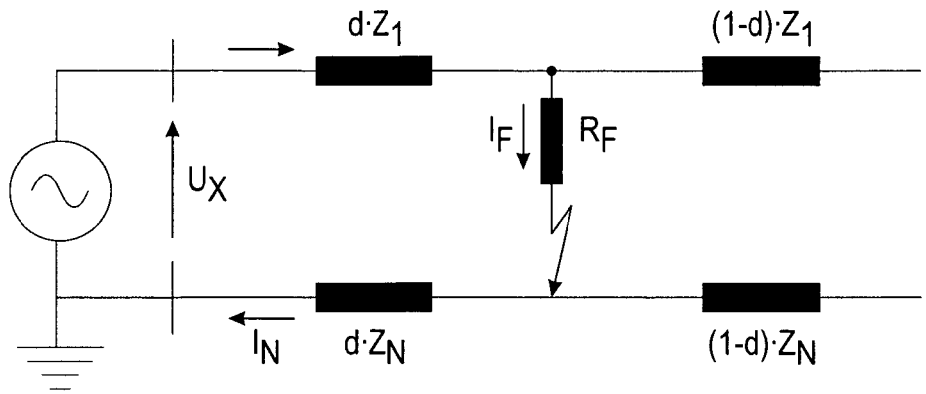
FIG. 1 is an equivalent circuit of a fault loop in a phase-to-earth fault on an electric line.
Figure 2:
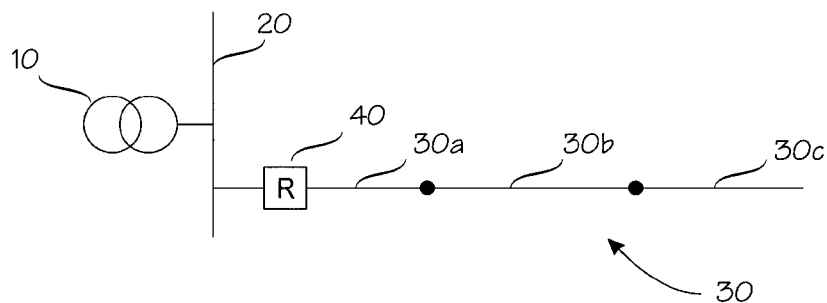
FIG. 2 is a diagram illustrating an electric network in which the invention can be used.

FIG. 2 is a diagram illustrating an electric network to which the invention can be applied. The figure only shows the components necessary for understanding the invention.

The exemplary network can be a medium voltage (e.g. 20 kV) distribution network fed through a substation comprising a transformer 10 and a busbar 20. The figure further shows an electric line outlet, i.e. a feeder 30 which consists of three sections 30a, 30b and 30c. The figure also shows a protective relay unit 40 at the beginning of the electric line 30. It should be noted that there may be any number of feeders or other network elements in the network. There may also be several feeding substations. Further, the invention can be utilized with a switching station without a transformer 10, for example. The network is a three-phase network although, for the sake of clarity, the phases are not shown in the figure.

The functionality of the invention can be implemented by means of a computer or corresponding digital signal processing equipment, such as a general-purpose digital signal processor (DSP), with suitable software therein, for example. It is also possible to use a specific integrated circuit or circuits, or corresponding components and devices. The invention can be implemented in existing system elements, such as various protective relays, or by using separate elements or devices. If the functionality of the invention is implemented by software, such software can be provided as a computer program product comprising computer program code which, when run on a computer, causes the computer or a corresponding signal processor to perform the functionality according to the invention, as will be described below. Such a computer program code can be stored on a computer readable medium, such as suitable memory means, e.g. a flash memory or a disc memory, from which it is loadable to the unit or units executing the program code. In addition, such a computer program code implementing the invention can be loaded to the unit or units executing the computer program code via a suitable data network, for example, and it can replace or update a possibly existing program code. In the exemplary system of FIG. 2, the functionality of the invention is preferably located in the relay unit 40. It is also possible that only some measurements are performed in unit 40 and the results are then transmitted to another unit or units (not shown in the figure) in another location for further processing.

The current and voltage values used in the following are preferably obtained by a suitable measuring arrangement including e.g. current and voltage transducers (not shown in the figure) connected to the phases of the electricity system. In most of the existing protection systems, these values are readily available and thus the implementation of the invention does not necessarily require any separate measuring arrangements. How these values are obtained is of no relevance to the basic idea of the invention and depends on the particular electricity system to be monitored. A phase-to-earth fault on the three-phase electric line 30 may be detected and the corresponding faulted phase may be identified e.g. by the protective relay 40 associated with the line 30. The particular way how the phase-to-earth fault is detected and the corresponding faulted phase is identified is of no relevance to the basic idea of the invention.

According to an embodiment of the invention, once a phase-to-earth fault is detected on an electric line (feeder) 30 and the corresponding faulted phase is identified, determination of the location of the phase-to-earth fault, taking into account the non-homogeneity of the feeder 30, preferably proceeds as follows: First, a reactance of a fault loop formed by the phase-to-earth fault is determined at a measuring point. In the exemplary system of FIG. 2, the measuring point can be the relay unit 40 in the beginning of the line 30. Next, a faulted section 30a, 30b or 30c of the electric line 30, i.e. the section on which the earth-fault has occurred, is determined. According to an embodiment of the invention, the faulted section of the electric line 30 is determined to be a section 30a, 30b or 30c closest to the measurement point of all such sections for which a sum of a positive sequence reactance and an earth return path reactance of the section in question and positive sequence reactances and an earth return path reactances of sections, if any, between the measurement point and the section in question is greater than or equal to the determined reactance of the fault loop. In other words, the faulted section is determined to be a section 30a, 30b or 30c of the electric line 30 for which the following is true:

positive sequence reactance and an earth return path reactance of the section in question+positive sequence reactances and earth return path reactances of sections, if any, between the measurement point and the section in question $\geq$ the determined reactance of the fault loop; and if the above equation is true for more than one section of the electric line 30, the section closest to the measurement point from among such sections fulfilling the above equation is selected to be the faulted section.

Finally, a distance D between the measuring point and a point of fault can be calculated according to the following formula:

$$D=D_P+((X_{Loop}-X_P)/X_F)\cdot D_F, \text{ where}$$

$X_{Loop}$=reactance of the fault loop $X_P$=sum of the positive sequence reactances and the earth return path reactances of sections, if any, between the measurement point and the faulted section of the electric line, $X_F$=sum of the positive sequence reactance and the earth return path reactance of the faulted section of the electric line, $D_P$=sum length of the sections, if any, between the measurement point and the faulted section of the electric line, and $D_F$=length of the faulted section of the electric line.

According to an embodiment of the invention, the reactance of the earth fault loop is determined e.g. according to the following formula. It should be noted, however, that the particular way in which the reactance of the fault loop is determined is not of relevance to the basic idea of the invention.

$$X_{Loop} = dpu \cdot (X_1 + X_N),$$

where $$dpu = \frac{\text{Im}(\underline{U}_X)\cdot\text{Re}(\underline{I}_X) - \text{Re}(\underline{U}_X)\cdot\text{Im}(\underline{I}_X)}{\text{Im}(Z_1\cdot\underline{I}_X)\cdot\text{Re}(\underline{I}_X) - \text{Re}(Z_1\cdot\underline{I}_X)\cdot\text{Im}(\underline{I}_X) - \text{Re}(Z_N\cdot\underline{I}_N)\cdot\text{Im}(\underline{I}_X) + \text{Im}(Z_N\cdot\underline{I}_N)\cdot\text{Re}(\underline{I}_X)}$$

dpu=fault distance in per unit $\underline{U}_X$=phase voltage phasor of the faulted phase of the line $Z_1$=positive sequence line impedance $(\Omega)=R_1+j\cdot X_1$ $R_1$=positive sequence line resistance $(\Omega)$ $X_1$=positive sequence line reactance $(\Omega)$ $X_N$=earth return path reactance of the line=$(X_0-X_1)/3$ $\underline{I}_X$=phase current phasor of the faulted phase of the line $Z_N$=earth return path impedance of the line $(\Omega)=(Z_0-Z_1)/3$.

$Z_0$=zero sequence line impedance $(\Omega)=R_0+j\cdot X_0$ $R_0$=zero sequence line resistance $(\Omega)$ $X_0$=zero sequence line reactance $(\Omega)$ $I_N$=earth return path current phasor of the line (=$I_{L1}$+$I_{L2}$+$I_{L3}$, where $I_{L1}$, $I_{L2}$ and $I_{L3}$ are the current phasors of the three phases of the line).

According to an embodiment of the invention, the faulted section 30a, 30b or 30c of the electric line 30 is determined by comparing stepwise, section by section, starting from the section closest to the measurement point, the sum of a positive sequence reactance and an earth return path reactance of the section in question and positive sequence reactances and an earth return path reactances of sections, if any, between the measurement point and the section in question with the determined reactance of the fault loop until said sum exceeds or equals to the determined reactance of the fault loop. An example of the stepwise comparison procedure is described in the following for the electric line 30 of FIG. 2, which line consists of three sections 30a, 30b and 30c. However, the method is general and is applicable to any number of line sections. The unit of length D can be kilometers or miles, for example. The positive sequence reactances [ohm] for the sections are $X_{1A}$, $X_{1B}$ and $X_{1C}$, respectively. The earth return path reactances [ohm] for the sections are $X_{NA}$, $X_{NB}$ and $X_{NC}$, respectively. The lengths of the sections are $D_A$, $D_B$, and $D_C$. The procedure preferably proceeds, once a phase-to-earth fault has been detected and the faulted phase has been identified, as follows:

Step 0. Determine $X_{Loop}$, i.e. the reactance of the fault loop formed by the phase-to-earth fault (imaginary part of $Z_{Loop}$ of equation 1)

Step 1. If $X_{Loop} \leq (X_{1A}+X_{NA})$, the fault distance D is:

$D=(X_{Loop}/(X_{1A}+X_{NA})) \cdot D_A$. Otherwise proceed to step 2.

Step 2. If $X_{Loop} \leq ((X_{1A}+X_{NA})+(X_{1B}+X_{NB}))$, the fault distance D is:

$D=D_A+((X_{Loop}-(X_{1A}+X_{NA}))/(X_{1B}+X_{NB})) \cdot D_B$. Otherwise proceed to step 3.

Step 3. Fault distance D is:

$$D=D_A+D_B+((X_{Loop}-(X_{1A}+X_{NA})-(X_{1B}+X_{NB}))/(X_{1C}+X_{NC})) \cdot D_C.$$

Figure 3:
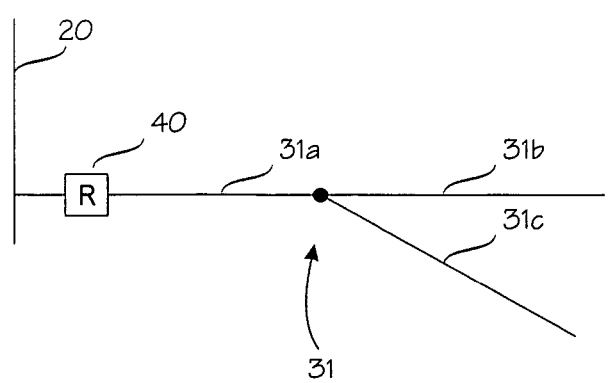
FIG. 3 is a diagram illustrating an electric network in which the invention can be used.

According to an embodiment of the invention, when the electric line comprises parallel branches and the faulted section of the electric line has been determined to be located on a section of such a branch, an alternative faulted section and distance between the measuring point and a point of fault is determined for each parallel branch thereof. FIG. 3 illustrates an example of an electric line 31, which comprises three line sections 31a, 31b and 31c. Line 31 branches after section 31a and branching sections 31b and 31c are parallel to each other. Thus, sections 31a, 31b and 31c could also be configured as 31a+31b and 31a+31c. In this case, if the fault is located behind the branching point, i.e. either on section 31b or 31c, it is preferable to calculate two alternatives for the fault location; one on section 31b and another on section 31c. In other words, if the stepwise procedure described above is used, it is preferable to go through configurations 31a+31b and 31a+31c separately unless the fault location is determined to be on section 31a, in which case it is not necessary to continue further. When alternative fault locations are determined, the selection of the actual fault location can then be determined using other information on the system. Although FIG. 3 for the sake of clarity illustrates a simple line configuration having only two line branches 31b and 31c, the above embodiment of the invention can be applied to a more complex line configuration in which a considerably larger number of branches may exist and in which the branches may also have sub-branches.

Figure 4A:
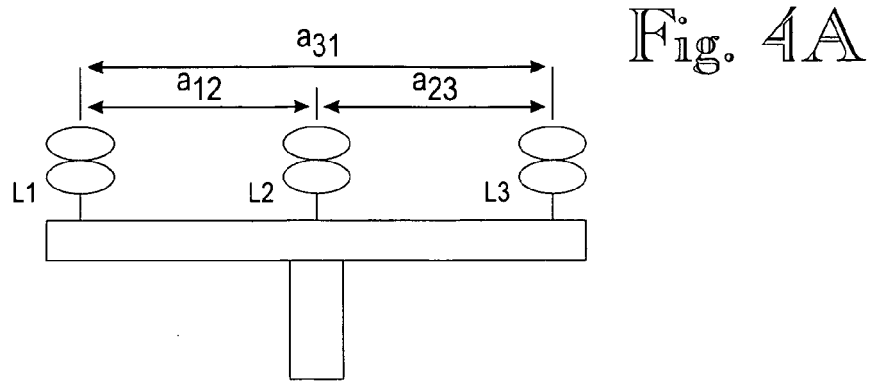
FIGS. 4A, 4B and 4C are diagrams illustrating various overheadline configurations.
Figure 4B:
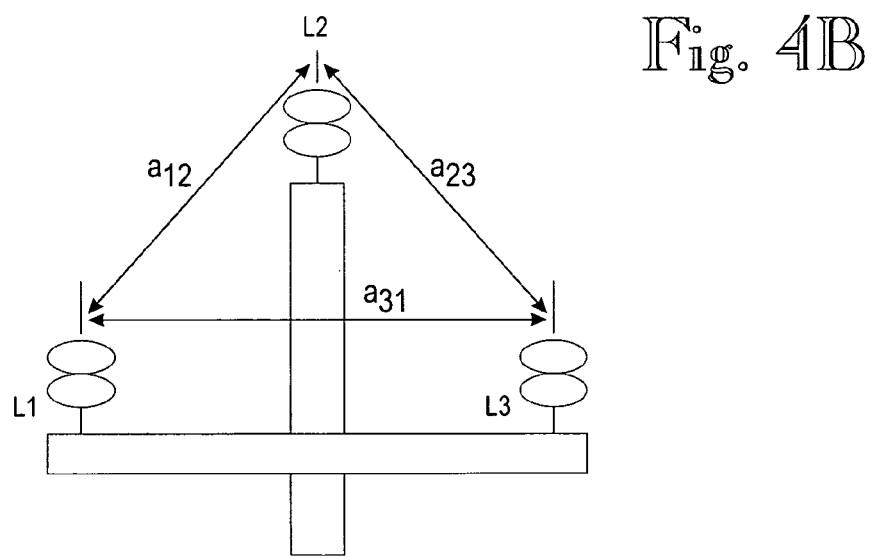
Figure 4C:
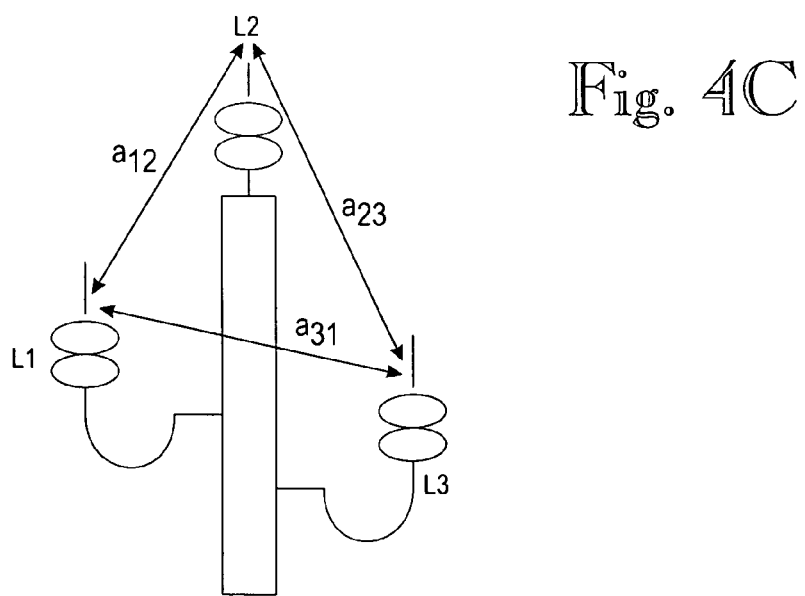

In the above calculations, it has been assumed that the positive sequence reactances and the earth return path reactances for the sections are known. Accurate fault localization requires accurate setting values for line reactances. The positive sequence reactance values for the line sections are typically known or can easily be obtained from datasheets. As datasheet values for overhead-lines are valid only for a certain tower configuration, it may be necessary that a user or operator of the protective system adjusts the data-sheet reactance values according to the actual installation configuration in order to minimize fault localization errors due to inaccurate settings. FIGS. 4A, 4B and 4C show various overhead-line configurations. In the figures, the three phases of the three-phase electricity system are referred to as L1, L2, and L3. Positive sequence reactances can be calculated using e.g. the following equation which applies to three-phase copper or aluminum overhead-lines:

$$X_1 \approx f_n \cdot 2\pi \cdot 10^{-4} \cdot \left(2 \cdot \ln \frac{a_{en}}{r} + 0.5\right)$$

[ohm/km]

where $f_n$=fundamental frequency, e.g. 50 or 60 Hz $a_{en}=(a_{12} \cdot a_{23} \cdot a_{31})^{1/3}$=geometric average of phase distances [m] as illustrated in FIGS. 4A, 4B and 4C $a_{xy}$=distance [m] between phases X and Y r=radius [m] for a single conductor.

ln=Natural logarithm

Corresponding zero sequence reactance values depend on actual installation conditions and configurations. A sufficient accuracy can, however, be achieved with rather simple calculations using the following equations which apply to three-phase overhead lines without ground wires:

$R_0[50\ Hz] \approx R_1+0.14804$      [Ω/km]

$R_0[60\ Hz] \approx R_1+0.17765$      [Ω/km]

$$X_0 \approx f_n \cdot 4\pi \cdot 10^{-4} \cdot \left(3 \cdot \ln \frac{W}{r_{en}} + 0.25\right)$$

[Ω/km]

where $R_1$=conductor AC resistance [Ω/km]

$f_n$=fundamental frequency [Hz]

$W=658 \cdot \sqrt{\rho_{earth}/f_n}$=equivalent depth of the earth return path [m]

$\rho_{earth}$=earth resistivity [Ω, m]

$$r_{en} = \left(r \cdot (a_{12}^2 \cdot a_{23}^2 \cdot a_{31}^2)^{\frac{1}{3}}\right)^{\frac{1}{3}}$$

[Ω, m]=equivalent radius for conductor bundle [m]

r=radius for a single conductor [m]

$a_{xy}$=distances between phases X and Y [m].

The earth return path reactances can then be calculated using the positive and zero sequence reactances as described above. It should be noted, however, that it is not relevant to the basic idea of the invention how the positive sequence reactances and earth return path reactances are determined.

It will be obvious to a person skilled in the art that as technology advances, the inventive concept can be implemented in various ways. The invention and its embodiments are not limited to the examples described above but may vary within the scope of the claims.

The invention claimed is:

1. A method for determining a location of a phase-to-earth fault in a three-phase electric line of an electric network, the electric line comprising two or more sections, each section having a predetermined positive sequence reactance and an earth return path reactance, the method comprising:
   detecting a phase-to-earth fault on the electric line;
   identifying a faulted phase of the electric line;
   determining, at a measuring point, a reactance of a fault loop formed by the phase-to-earth fault,
   determining a faulted section of the electric line to be a section closest to the measurement point of all such sections for which a sum of a positive sequence reactance and an earth return path reactance of the section in question and positive sequence reactances and an earth return path reactances of sections, if any, between the measurement point and the section in question is greater than or equal to the determined reactance of the fault loop; and
   calculating a distance D between the measuring point and a point of fault according to the following formula:

$D=D_P+((X_{Loop}-X_P)/X_F)\cdot D_F$, where $X_{Loop}$=reactance of the fault loop
   $X_P$=sum of the positive sequence reactances and the earth return path reactances of sections, if any, between the measurement point and the faulted section of the electric line,
   $X_F$=sum of the positive sequence reactance and the earth return path reactance of the faulted section of the electric line,
   $D_P$=sum length of the sections, if any, between the measurement point and the faulted section of the electric line, and
   $D_F$=length of the faulted section of the electric line.

2. The method of claim 1, wherein the reactance of the fault loop is determined according to the following formula:

$X_{Loop}=dpu\cdot(X_1+X_N)$, where $$dpu = \frac{\text{Im}(\underline{U}_X)\cdot\text{Re}(\underline{I}_X) - \text{Re}(\underline{U}_X)\cdot\text{Im}(\underline{I}_X)}{\text{Im}(\underline{Z}_1\cdot\underline{I}_X)\cdot\text{Re}(\underline{I}_X) - \text{Re}(\underline{Z}_1\cdot\underline{I}_X)\cdot\text{Im}(\underline{I}_X) - \text{Re}(\underline{Z}_N\cdot\underline{I}_N)\cdot\text{Im}(\underline{I}_X) + \text{Im}(\underline{Z}_N\cdot\underline{I}_N)\cdot\text{Re}(\underline{I}_X)}$$

where
   $\underline{U}_X$=phase voltage phasor of the faulted phase of the line
   $\underline{Z}_1$=positive sequence line impedance
   $R_1$=positive sequence line resistance
   $X_1$=positive sequence line reactance
   $X_N$=earth return path reactance of the line
   $\underline{I}_X$=phase current phasor of the faulted phase of the line
   $\underline{Z}_N$=earth return path impedance of the line
   $\underline{Z}_0$=zero sequence line impedance
   $R_0$=zero sequence line resistance
   $X_0$=zero sequence line reactance
   $\underline{I}_N$=earth return path current phasor.

3. The method of claim 1, wherein the faulted section of the electric line is determined by comparing stepwise, section by section, starting from the section closest to the measurement point, the sum of positive sequence reactance and an earth return path reactance of the section in question and positive sequence reactances and an earth return path reactances of sections, if any, between the measurement point and the section in question with the determined reactance of the fault loop until said sum exceeds or equals the determined reactance of the fault loop.

4. The method of claim 1, wherein when the electric line comprises parallel branches and the faulted section of the electric line has been determined to be located on a section of such a branch, an alternative faulted section and distance between the measuring point and a point of fault is determined for each parallel branch thereof.

5. A system for determining a location of a phase-to-earth fault in a three-phase electric line of an electric network, the electric line comprising two or more sections, each section having a predetermined positive sequence reactance and an earth return path reactance, the system being configured to:
   detect a phase-to-earth fault on the electric line;
   identify a faulted phase of the electric line;
   determine, at a measuring point, a reactance of a fault loop formed by the phase-to-earth fault,
   determine a faulted section of the electric line to be a section closest to the measurement point of all such sections for which a sum of a positive sequence reactance and an earth return path reactance of the section in question and positive sequence reactances and an earth return path reactances of sections, if any, between the measurement point and the section in question is greater than or equal to the determined reactance of the fault loop; and
   calculate a distance D between the measuring point and a point of fault according to the following formula:

$D=D_P+((X_{Loop}-X_P)/X_F)\cdot D_F$, where $X_{Loop}$=reactance of the fault loop
   $X_P$=sum of the positive sequence reactances and the earth return path reactances of sections, if any, between the measurement point and the faulted section of the electric line,
   $X_F$=sum of the positive sequence reactance and the earth return path reactance of the faulted section of the electric line,
   $D_P$=sum length of the sections, if any, between the measurement point and the faulted section of the electric line, and
   $D_F$=length of the faulted section of the electric line.

6. The system of claim 5, wherein the system is configured to determine the reactance of the fault loop according to the following formula:

$X_{Loop}=dpu\cdot(X_1+X_N)$, where $$dpu = \frac{\text{Im}(\underline{U}_X)\cdot\text{Re}(\underline{I}_X) - \text{Re}(\underline{U}_X)\cdot\text{Im}(\underline{I}_X)}{\text{Im}(\underline{Z}_1\cdot\underline{I}_X)\cdot\text{Re}(\underline{I}_X) - \text{Re}(\underline{Z}_1\cdot\underline{I}_X)\cdot\text{Im}(\underline{I}_X) - \text{Re}(\underline{Z}_N\cdot\underline{I}_N)\cdot\text{Im}(\underline{I}_X) + \text{Im}(\underline{Z}_N\cdot\underline{I}_N)\cdot\text{Re}(\underline{I}_X)}$$

where
   $\underline{U}_X$=phase voltage phasor of the faulted phase of the line
   $\underline{Z}_1$=positive sequence line impedance
   $R_1$=positive sequence line resistance
   $X_1$=positive sequence line reactance
   $X_N$=earth return path reactance of the line
   $\underline{I}_X$=phase current phasor of the faulted phase of the line
   $\underline{Z}_N$=earth return path impedance of the line $Z_0$=zero sequence line impedance
$R_0$=zero sequence line resistance
$X_0$=zero sequence line reactance
$\underline{I}_N$=earth return path current phasor.

7. The system of claim 5, wherein the system is configured to determine the faulted section of the electric line by comparing stepwise, section by section, starting from the section closest to the measurement point, the sum of a positive sequence reactance and an earth return path reactance of the section in question and positive sequence reactances and an earth return path reactances of sections, if any, between the measurement point and the section in question with the determined reactance of the fault loop until said sum exceeds or equals the determined reactance of the fault loop.

8. The system of claim 5, wherein when the electric line comprises parallel branches and the system has determined the faulted section of the electric line to be located on a section of such a branch, the system is further configured to determine an alternative faulted section and distance between the measuring point and a point of fault for each parallel branch thereof.

9. The system of claim 5, wherein the system comprises a protective relay.

10. A computer program product comprising computer program code, wherein execution of the program code in a computer causes the computer to carry out the steps of the method according to claim 1.

* * * * *